United States Patent
Kawaguchi

(10) Patent No.: US 6,245,622 B1
(45) Date of Patent: *Jun. 12, 2001

(54) METHOD FOR FABRICATING SEMICONDUCTOR INTEGRATED CIRCUIT DEVICE INCLUDING STEP OF FORMING SELF-ALIGNED METAL SILICIDE FILM

(75) Inventor: Hiroshi Kawaguchi, Toyko (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/731,462

(22) Filed: Oct. 11, 1996

Related U.S. Application Data

(63) Continuation of application No. 08/389,412, filed on Feb. 16, 1995, now abandoned.

(30) Foreign Application Priority Data

Feb. 17, 1994 (JP) .................................................... 6-041758

(51) Int. Cl.$^7$ .................................................. H01L 21/336
(52) U.S. Cl. ........................... 438/305; 438/525; 438/664; 438/683
(58) Field of Search .............................. 437/35, 41 SM, 437/44, 200; 438/233, 305, 303, 525, 528, 586, 649, 655, 683, 302, 663, 664

(56) References Cited

U.S. PATENT DOCUMENTS

| | | | |
|---|---|---|---|
| 4,339,869 | * 7/1982 | Reihl et al. | 438/526 |
| 4,551,908 | * 11/1985 | Nagasawa et al. | 438/659 |
| 4,558,507 | * 12/1985 | Okabayashi et al. | 438/301 |
| 4,644,386 | * 2/1987 | Nishizawa et al. | 257/339 |
| 4,676,866 | * 6/1987 | Tang et al. | 438/643 |
| 4,701,349 | * 10/1987 | Koyanagi et al. | 438/655 |
| 5,223,445 | * 6/1993 | Fuse | 438/302 |
| 5,270,227 | * 12/1993 | Kameyama et al. | 438/234 |
| 5,300,804 | * 4/1994 | Arai | 257/332 |

FOREIGN PATENT DOCUMENTS

| | | | |
|---|---|---|---|
| 62-33466 | * 2/1987 | (JP) | 438/FOR 360 |
| 63-117420 | * 5/1988 | (JP) | 438/FOR 360 |
| 1-179415 | * 7/1989 | (JP) | 438/FOR 360 |
| 4-142732 | 5/1992 | (JP) . | |
| 5-291180 | * 11/1993 | (JP) | 439/FOR 360 |

OTHER PUBLICATIONS

Rausch, W., et al., "Palladium Silicide Contact . . .", IBM Tech. Disc. Bull., 24(7A), Dec. 1981, p. 3453.*

* cited by examiner

Primary Examiner—T. N. Quach
(74) Attorney, Agent, or Firm—McGuireWoods LLP

(57) ABSTRACT

The method for fabricating a semiconductor integrated circuit device disclosed includes the steps wherein an active region is defined so as to be surrounded by an insulating film on a silicon substrate, a surface of the active region and a semiconductor layer that extends underneath the insulating film are changed to an amorphous state by implantation of ions from oblique angles, a metal film is formed over the silicon substrate, and a metal silicide layer is formed by a thermal-treatment causing the metal film and silicon in the amorphous state to react with each other. In this way, it is possible to form a sufficiently thick silicide layer even on a narrow line width diffusion layer.

6 Claims, 5 Drawing Sheets

METHOD FOR FABRICATING SEMICONDUCTOR INTEGRATED CIRCUIT DEVICE INCLUDING STEP OF FORMING SELF-ALIGNED METAL SILICIDE FILM

This is a File Wrapper Continuation of U.S. patent application Ser. No. 08/389,412, filed Feb. 16, 1995, abandoned.

BACKGROUND OF THE INVENTION

(1) Field of the Invention

The present invention relates to a method for fabricating a semiconductor integrated circuit device, and more particularly to a method for fabricating a semiconductor integrated circuit device, including a step of forming a metal silicide film in a self-aligned form with respect to a diffusion layer.

(2) Description of the Related Art

In recent years, there have been significant developments in the miniaturization and high degree of integration of semiconductor integrated circuit devices. To this end, for example, in the fabrication of MOS type semiconductor integrated circuits, advances have been made for the prevention of the occurrence of a punch-through current by using shallow source/drain junctions. However, where the source/drain region is formed in a shallow form, there are increases in a source resistance and a drain resistance, and also there is an increase in a contact resistance, which lead to a deterioration of transistor performance. In order to avoid this problem, use is now made of a salicide (Self-Aligned Silicide) technique whereby a silicide film is formed in a self-aligned form on a surface of the source/drain region.

The silicide film is usually formed on a diffusion layer and, where the dopant of the diffusion layer consists of arsenic (As) and where, especially, the impurity concentration thereof is high, the silicide film forming speed is slow. Thus, in the case of, for example, the process for fabricating CMOS circuits, there arises a problem wherein the film thicknesses of an n-channel transistor and a p-channel transistor are different. The trend becomes more significant as the dimensions of the diffusion layer are made smaller.

Japanese Patent Application Kokai Publication No. Hei 5-291180 proposes to change a silicon surface to an amorphous state in order to avoid the above mentioned problem. The conventional technique proposed in the publication is explained with reference to FIGS. 1–4.

First, by using a known LOCOS (Local Oxidation of Silicon) technique, a field oxide film 302 is formed on a silicon substrate 301 and, after impurity ion-implantation, a thermal treatment is carried out so as to form a diffusion layer 303. As sources of the impurity ions, use is made of arsenic (As), phosphorus (P), etc. in the case of an n-type diffusion layer and of boron (B), $BF_2$, etc. in the case of a p-type diffusion layer.

Then, ion beams are irradiated on a surface of the silicon substrate 301, in a direction vertical with respect to this surface, so that the crystalline structure of the silicon substrate 301 is destroyed and an amorphous silicon 5 layer 305 is formed as shown in FIG. 1. The ion sources used here are arsenic, phosphorus, etc.

Next, on the entire surface, a titanium film 306 is formed by the deposition of titanium (Ti) using such a method as a DC magnetron sputtering (FIG. 2). An appropriate thickness of the titanium film 306 is in the order of 20~40 nm. Then, thermal treatments are carried out in a nitrogen atmosphere as a first stage thereof, for example, for 30 seconds at a temperature from 600° C. to 700° C. and, as a second stage thereof, for example, for 30 seconds at a temperature 700° C. to 900° C., whereby the silicon of the amorphous silicon layer 305 and the titanium are caused to react with each other, and the titanium silicide film 307 is formed as shown in FIG. 3.

The portion of the amorphous silicon layer 305 that remains unreacted with the titanium during the above thermal treatments undergoes recrystallization so that, after the completion of the thermal treatments, the unreacted portion of the amorphous silicon becomes the integral part of the diffusion layer 303 having a crystalline structure, and the amorphous silicon layer 305 no longer exists.

Finally, the removal of the unreacted titanium film 306 in a solution such as ammonia or hydrogen peroxide results in a semiconductor device structure as shown in FIG. 4. Subsequently, in order to enhance the stabilization of the titanium silicide structure, a thermal treatment at a temperature of 800° C.~900° C. for about 5 to 20 seconds may optionally be carried out.

Another conventional example is disclosed in Japanese Patent Application Kokai Publication No. Hei 4-142732 wherein, for purposes of providing a space between a high concentration impurity region for device isolation located under a field oxide film and a silicide film, the impurity is introduced using a rotating oblique ion-implantation method, and the diffusion layer that is in contact with the silicide film is formed.

In the Japanese Patent Application Kokai Publication No. Hei 5-291180, it is shown that, by employing the method proposed therein, a stable titanium silicide film is formed both in the case where the dopant of the diffusion layer is arsenic and in the case where the line width of the diffusion layer is reduced to a minute value such as about 0.5 µm. However, if a further reduction in the value is made, it has been found that the formation of a stable titanium silicide becomes difficult if it is only made into an amorphous state. This is because, in the case where the line width becomes narrower as in the prior art example, there is an insufficiency of the amorphous silicon at the ends of the field oxide film presumably due to an increase in the effect of the suppression of the reaction. That is, in the prior art example, the change of silicon to an amorphous state is made through the ion-implantation in the vertical directions so that, at the two narrow ends of the diffusion layer that are sandwiched between the field oxide film and the silicon substrate, the silicon that has changed to an amorphous state is insufficient with respect to the silicide film to be formed. Thus, due to the insufficient supply of silicon, the silicide film to be formed is limited.

Also, in the method proposed in the Japanese Patent Application Kokai Publication No. Hei 4-142732, there have been problems in that, since the method is not one in which the silicon substrate is changed to an amorphous state, it is difficult to form a silicide on a diffusion layer which contains arsenic at a high concentration and also that, similarly as discussed in the other Patent Application Kokai Publication (Hei 5-291180), it is difficult to form a stable silicide film at a diffusion layer whose line width is reduced to minute values.

SUMMARY OF THE INVENTION

An object of the invention, therefore, is to overcome the problems existing in the prior art and to provide a method for fabricating a semiconductor device, which is capable of forming a sufficiently thick silicide film even on a narrow width diffusion layer.

A further object of the invention is to provide a method which includes a step of forming a metal silicide film in a self-aligned form.

According to one aspect of the invention, there is provided a method for fabricating a semiconductor integrated circuit device, comprising the steps of:

defining an active region so as to be surrounded by an insulating film on a silicon substrate;

changing to an amorphous state a surface of the active region and a semiconductor layer that extends underneath the insulating film by implanting ions from oblique angles;

forming a metal film over the silicon substrate by depositing a metal; and forming a metal silicide layer by a thermal treatment causing the metal film and silicon in the amorphous state to react with each other.

According to another aspect of the invention, there is provided a method for fabricating a semiconductor integrated circuit device, comprising the steps of:

defining an active region so as to be surrounded by an insulating film on a silicon substrate;

forming a metal film over the silicon substrate by depositing a metal;

changing to an amorphous state a surface of the active region and a semiconductor layer that extends underneath the insulating film by implanting ions from oblique angles; and forming a metal silicide layer by a thermal treatment causing the metal film and silicon in the amorphous state to react with each other.

In the method according to the invention, the treatment for changing a surface of the silicon substrate to an amorphous state, which either precedes or follows the formation of a metal film for the formation of a silicide layer, is carried out by a rotating oblique ion-implantation method. Thus, for the thermal process which is carried out thereafter, the silicon for the formation of silicide is sufficiently supplied even to the end portions of the field oxide film. Therefore, according to the invention, a sufficiently thick silicide film can be stably formed on a diffusion layer whose width is even below 0.4 $\mu$m.

BRIEF DESCRIPTION OF THE DRAWINGS

The above and other objects, features and advantages of the present invention will be apparent. from the following description of preferred embodiments of the invention explained with reference to the accompanying drawings, in which.

PREFERRED EMBODIMENTS OF THE INVENTION

Now, preferred embodiments of the invention are explained with reference to the drawings.

FIGS. 5–8 show in diagrammatic sectional views a structure of a first embodiment according to the invention.

Figure 1:
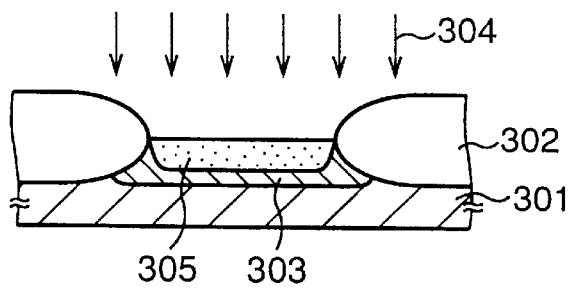
FIGS. 1–4 are diagrammatic sectional views of a conventional semiconductor integrated circuit device for explaining respective steps for fabricating the same.
Figure 2:
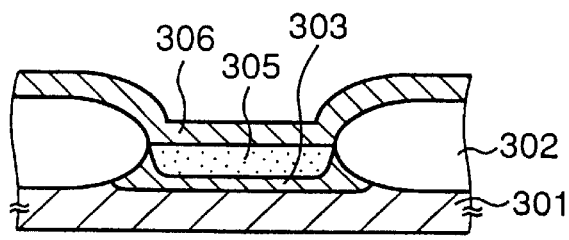
Figure 3:
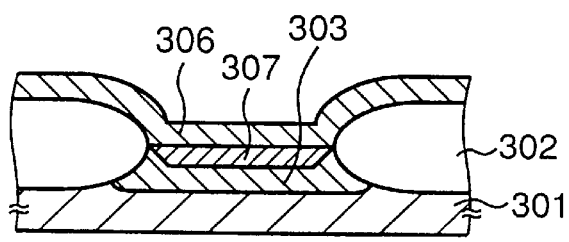
Figure 4:
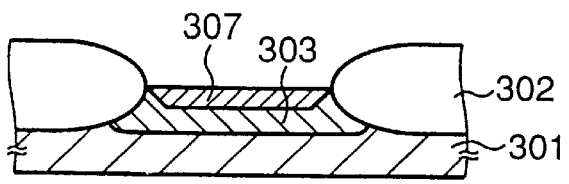
Figure 5:
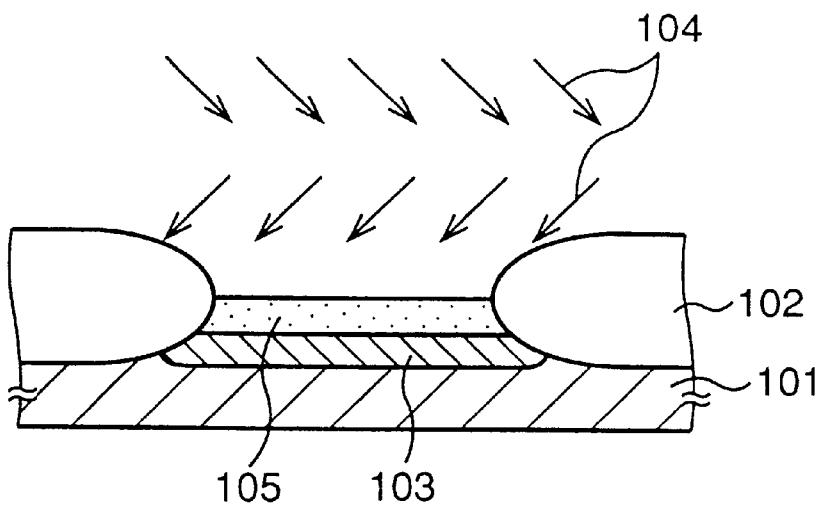
FIGS. 5–8 are diagrammatic sectional views of a semiconductor integrated circuit device of a first embodiment according to the invention for explaining respective steps for fabricating the same.

First, by using a known LOCOS technique, a field oxide film 102 having a thickness of 0.7 $\mu$m is formed on a silicon substrate 101 and, after arsenic in the order of $5\times10^{15}/cm^2$ is ion-implanted, a thermal treatment is carried out so as to form a diffusion layer 103. Then, silicon is introduced on the entire surface of the substrate by an ion-implantation method. In this state, the substrate surface is inclined at an angle of 45° with respect to the ion beams and the ion beams are incident thereon while it is being rotated about the axis of rotation in the direction of ion beams. At the surface of the diffusion layer 103, the crystalline structure is completely destroyed and, as a result, an amorphous silicon layer 105 is formed on the surface of the diffusion layer 103 as shown in FIG. 5.

In the embodiment according to the invention, since the ions are implanted by the rotating oblique ion-implantation method, it should be noted that the amorphous silicon layer 105 is formed not only on the surface of the substrate but formed also underneath the field oxide film 102.

Figure 6:
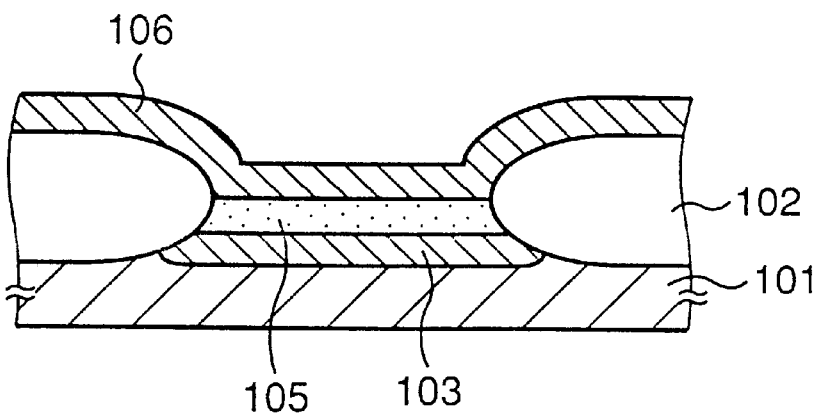

Next, as shown in FIG. 6, on the entire surface, a titanium film 106 is formed by the deposition of titanium (Ti) using such a method as a DC magnetron sputtering. An appropriate thickness of the titanium film 106 is in the order of 20~40 nm. Then, a thermal treatment is carried out for 20 to 60 seconds at a temperature from 650° C. to 700° C., whereby the silicon of the amorphous silicon layer 105 and the titanium are caused to react with each other and the titanium silicide film 107 is formed on the diffusion layer 103 as shown in FIG. 7.

Under the above condition, since the amorphous silicon layer 105 is present at a region extending from an end portion to an underside portion of the field oxide film as shown in FIG. 6, the supply of silicon that is required for the formation of titanium silicide is sufficiently met even at the end portion of the field oxide film. Thus, the suppression of the reaction at the end portion of the field oxide film is reduced and, as a result, a sufficiently thick titanium silicide film is stably formed, as in the case of a wide diffusion layer, even in the case where the width of the diffusion layer is not larger than 0.4 $\mu$m. The inventor has found by experimentation that, if the incident angle of beams with respect to the surface of the substrate is 20° or larger, it is possible to stably form a silicide film having a low resistance.

Figure 13A:
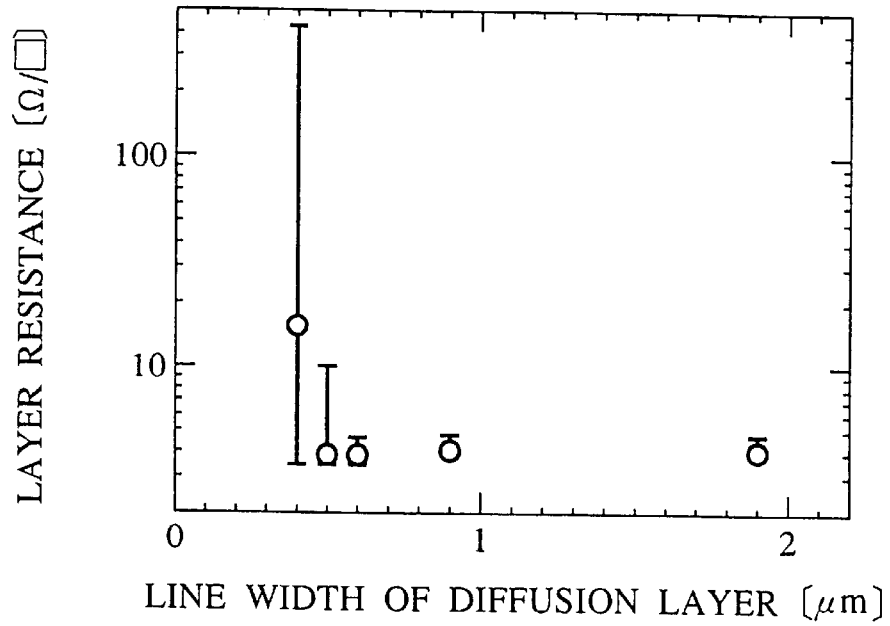
FIGS. 13A and 13B are graphs for showing diffusion layer width dependency characteristics of sheet resistance of a titanium silicide film formed on a diffusion layer, FIG. 13A being related to the conventional method described, and FIG. 13B being related to the first embodiment according to the invention.
Figure 13B:
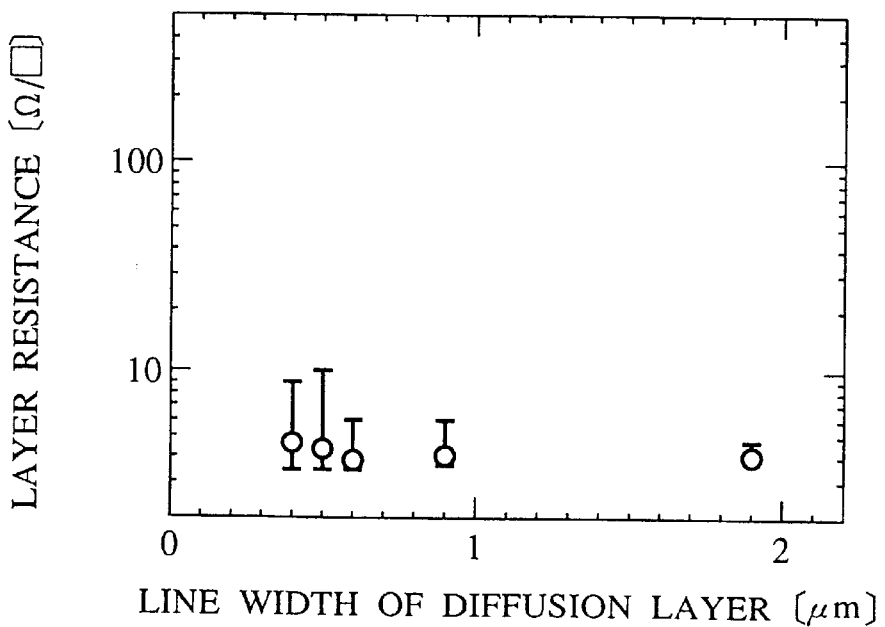

FIG. 13A shows the data for the diffusion layer width dependency characteristics of sheet resistance of the titanium silicide film that is formed on the diffusion layer by a conventional ion-implantation method wherein ions are vertically implanted for the formation of an amorphous layer, and FIG. 13B shows the same for the embodiment of the present invention where the ions are implanted using the rotating oblique ion-implantation method with the oblique angle being 45°. Where the line width is as large as about 2 $\mu$m, no significant difference in the sheet resistances is observed but, where the line width is as narrow as 0.4 $\mu$m or narrower, the variation in the sheet resistances becomes abruptly large in the case of the conventional method whereas, according to the present invention, such variation shows no significant increase and is essentially of the same value as that of the sheet resistance in the thick line width.

Figure 7:
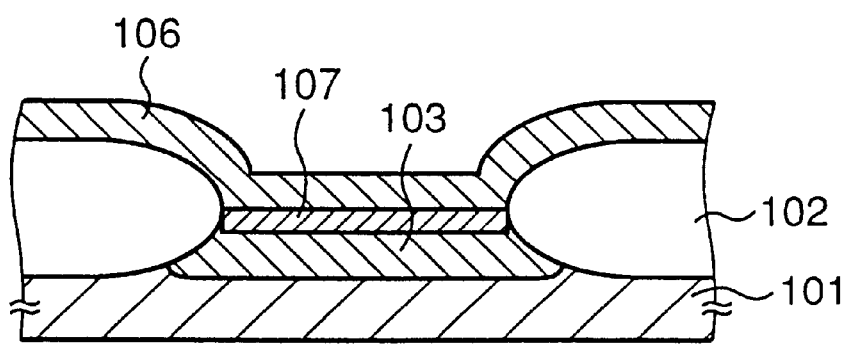

The portion of the amorphous silicon layer 105 that remains unreacted with the titanium during the above thermal treatment undergoes recrystallization so that, after the completion of the thermal treatment, the unreacted portion of the amorphous silicon becomes the integral part of the diffusion layer 103 having a crystalline structure and the amorphous silicon layer 105 becomes non-existent as shown in FIG. 7.

Figure 8:
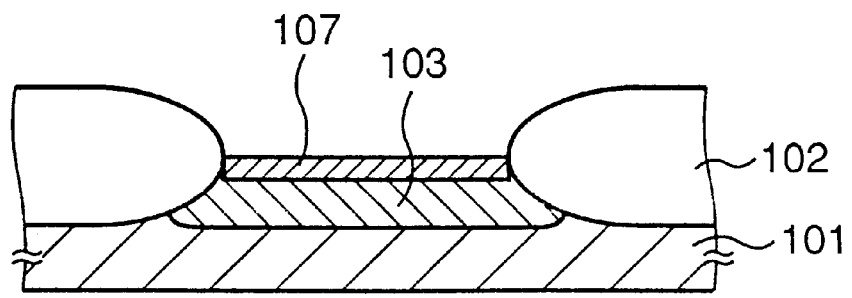

Then, the unreacted titanium film 106 is removed in a solution of ammonia/hydrogen peroxide as shown in FIG. 8. Subsequently, in order to enhance the stabilization of the titanium silicide structure, a thermal treatment at a temperature of 800° C.~900° C. for about 5 to 20 seconds may optionally be carried out.

FIGS. 9–12 show in diagrammatic sectional views a structure of a second embodiment according to the invention. This embodiment relates to the formation of a silicide layer for a source/drain region of a MOSFET.

First, by using a known LOCOS technique, a field oxide film 202 is formed on a non-active region of a p-type silicon substrate 201, and a gate insulating film 208 is formed in an active region surrounded by the field oxide film 202.

Then, a phosphorus doped polysilicon film is formed, and this film is patterned to form a gate electrode 209. Following this, phosphorus is ion-implanted using the field oxide film 202 and the gate electrode 209 as masks whereby an LDD (Lightly Doped Drain) region 210 is formed. Then, by depositing a silicon dioxide film and anisotropically etching this film, the sidewall 211 is formed for the gate electrode 209. Next, using the field oxide film 202, the gate electrode 209 and the sidewall 211 as masks, arsenic is ion-implanted thereby forming a diffusion layer 203.

Figure 9:
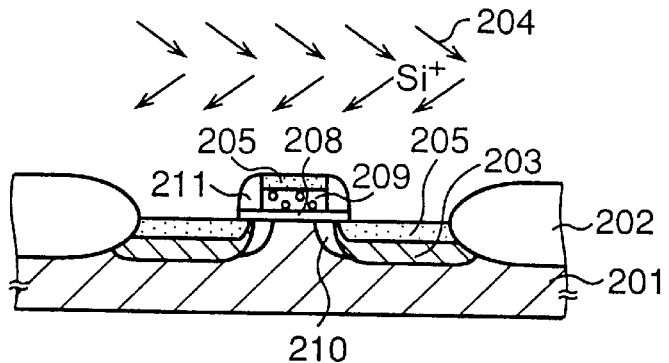
FIGS. 9–12 are diagrammatic sectional views of a semiconductor integrated circuit device of a second embodiment according to the invention for explaining respective steps for fabricating the same.

Then, in the same manner as in the first embodiment, silicon is ion-implanted by the rotating oblique ion-implantation method, and an amorphous silicon layer 205 is formed as shown in FIG. 9. Since the silicon is implanted from oblique directions, the amorphous silicon layer 205 is formed not only on the surface of the substrate but also formed extending under the field oxide film 202 and under the sidewall 211.

Figure 10:
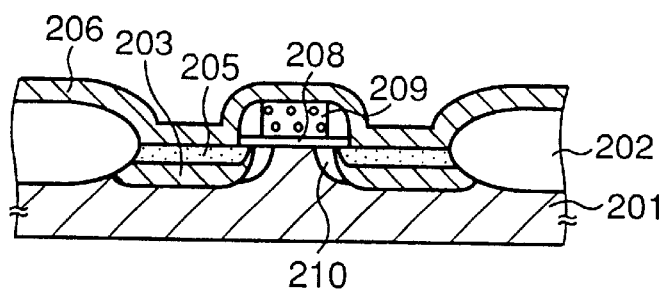
Figure 11:
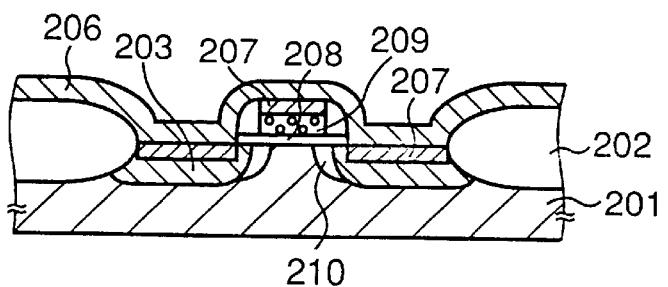

Next, on the entire surface, a titanium film 206 having a thickness of 30 nm is formed by the deposition of titanium using such a method as a DC magnetron sputtering as shown in FIG. 10. Then, a thermal treatment is carried out for 20 to 60 seconds at a temperature from 650° C. to 700° C., whereby the silicon of the amorphous silicon layer 205 and the titanium are caused to react with each other and the titanium silicide film 207 is formed on a surface of the diffusion layer 203 and a surface of the gate electrode 209 as shown in FIG. 11. Under this state, since the amorphous silicon layer 205 is present at a region under the field oxide film 202 and under the sidewall 211, the supply of silicon that is required for the formation of titanium silicide is sufficiently met even at the end portion of the field oxide film 202 and the end portion of the sidewall 211. As a result, a sufficiently thick titanium silicide film 207 is stably formed even on a narrow diffusion layer.

Figure 12:
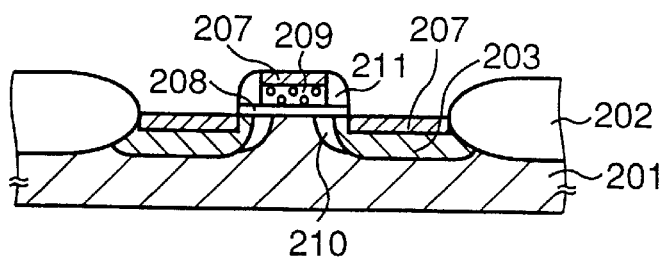

Then, the unreacted titanium film 206 is removed in a solution of ammonia/hydrogen peroxide as shown in FIG. 12. Subsequently, in order to enhance the stabilization of the titanium silicide structure, a thermal treatment at a temperature of 800° C.~900° C. for about 5 to 20 seconds may optionally be carried out.

While the invention has been described in its preferred embodiments, it is to be understood that the words which have been used are words of description rather than limitation and that changes within the purview of the appended claims may be made without departing from the true scope and spirit of the invention in its broader aspects. For example, in the embodiments described, titanium has been used as the metal for forming silicide but this may well be replaced by cobalt (Co), molybdenum (Mo), tungsten (W), tantalum (Ta), platinum (Pt), nickel (Ni), etc. Also, the ion sources implanted for making the silicon substrate amorphous may be other group IV element such as germanium (Ge), and may be such ion sources that determine conductivity types such as phosphorus (P), arsenic (As), boron (B), $BF_2$, etc. In the latter case, the step of forming the diffusion layer may be replaced by steps of forming a non-amorphous silicon layer and carrying out a thermal treatment for forming a silicide. Furthermore, in the embodiments described, the thermal treatment for forming silicide has been carried out in a single stage, but this may be carried out in two stages. Also, in the embodiments described, the ion-implantation for making silicon amorphous has preceded the formation of the metal film, but this may be carried out after the formation of the metal film.

What is claimed is:

1. A method for fabricating a semiconductor integrated circuit device, comprising the steps of:

defining an active region surrounded by an insulating film on a silicon substrate;

forming a gate electrode of polycrystalline silicon on a gate insulating film formed on said active region;

forming a first diffusion layer comprising a lightly doped drain (LDD) by ion-implantation using said gate electrode and said insulating film as a mask;

forming a sidewall insulating film at a sidewall of said gate electrode;

forming a second diffusion layer by ion-implantation using said gate electrode, said insulating film, and said sidewall insulating film as masks;

inclining said silicon substrate at an oblique angle with respect to ion implantation beams;

rotating said silicon substrate about an axis of rotation in the direction of said ion beams to change to an amorphous state layer a surface of said active region, a surface of said silicon substrate that extends underneath said insulating film and said sidewall insulating film, and a surface of said gate electrode by implanting ions from oblique angles;

forming a metal film at least over said silicon substrate and said gate electrode by depositing a metal;

forming a self-aligned metal silicide layer by a thermal treatment causing said metal film and silicon in said amorphous state layer to react with each other;

removing unreacted said metal film with a solution of ammonia and hydrogen peroxide; and stabilizing said metal silicide layer with a thermal treatment at 800°–900° C. for 5–20 seconds.

2. The method for fabricating a semiconductor integrated circuit device according to claim 1, in which said step of implanting ions from the oblique angles is carried out by a rotating oblique ion-implantation process.

3. The method for fabricating a semiconductor integrated circuit device according to claim 1, wherein said step of implanting ions from the oblique angles is carried out at an angle larger than 20° normal to the substrate.

4. The method of fabricating a semiconductor integrated circuit device of claim according to claim 1, wherein said metal deposited on said silicon substrate is selected from a group of metals consisting of titanium, cobalt, tungsten, molybdenum, tantalum, platinum, and nickel.

5. The method for fabricating a semiconductor integrated circuit device according to claim 4, in which said ions are selected from a group of ions consisting of a silicon ion, a germanium ion, an arsenic ion, phosphorus ion and a $BF_2$ ion.

6. A method for fabricating a semiconductor integrated circuit having improved conductivity of a titanium silicide layer, comprising the steps of:

defining an active region surrounded by an insulating film on a silicon substrate;

implanting ions at a 20° rotating oblique angle to change to amorphous silicon a surface of said active region extending beneath said insulating film;

depositing a titanium film over said silicon substrate; and heating to cause said titanium film and said amorphous silicon to form a titanium silicide layer;

removing unreacted said titanium film; and stabilizing said titanium silicide layer with a thermal treatment at 800°–900° C. for 5–20 seconds.

* * * * *